US012592722B2

(12) United States Patent
Xia et al.

(10) Patent No.: US 12,592,722 B2
(45) Date of Patent: Mar. 31, 2026

(54) SOFT INFORMATION GENERATION FOR CONCATENATED FORWARD ERROR CORRECTION IN DIGIRAL SIGNAL PROCESSING

(71) Applicant: Avago Technologies International Sales Pte. Limited, Singapore (SG)

(72) Inventors: Haitao Xia, Sunnyvale, CA (US); John Szeming Wang, Sunnyvale, CA (US); Vasudevan Parthasarathy, Irvine, CA (US); Chung-Jue Chen, Irvine, CA (US); Sian She, Lafayette, CO (US); Thomas V. Souvignier, Boulder, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 18/652,085

(22) Filed: May 1, 2024

(65) Prior Publication Data

US 2025/0343561 A1     Nov. 6, 2025

(51) Int. Cl.
H03M 13/00 (2006.01)
H03M 13/41 (2006.01)

(52) U.S. Cl.
CPC .... H03M 13/6331 (2013.01); H03M 13/4146 (2013.01)

(58) Field of Classification Search
CPC ................................................ H03M 13/6331
See application file for complete search history.

(56) References Cited

U.S. PATENT DOCUMENTS 8,665,929 B1 * 3/2014 Lida ...................... H04J 3/0641
                                                          375/348
2006/0245761 A1 * 11/2006 Shastri ................... H04B 10/66
                                                          398/147

(Continued)

FOREIGN PATENT DOCUMENTS

EP        3545657 B1    4/2022
WO   2023011294 A1    2/2023

OTHER PUBLICATIONS

Partial European Search Report for Application No. 25173040.4 dated Sep. 18, 2025, 16 pages.

(Continued)

*Primary Examiner* — Joseph D Torres
(74) *Attorney, Agent, or Firm* — Quarles & Brady LLP

(57) ABSTRACT

A method for generating soft information for a digital signal decoder. The method includes receiving a first plurality of signals, each corresponding to a time index, each time index being associated with two states including state 1 and state 0. The method also includes processing the first plurality of signals to calculate path metric values of state 0 and 1 for generating each of a second plurality of most-likely symbols by hard decisions and intermediate information for a most-likely path and a second-likely path at each time index. The method includes computing a difference between the most-likely path and a second-likely path for a given one of the two states at each time index. The method also includes determining a soft information corresponding to either one of the two states at the time index per one of the second plurality of most-likely symbols.

2 Claims, 10 Drawing Sheets

(56)                 References Cited

U.S. PATENT DOCUMENTS

| | | | |
|---|---|---|---|
| 2009/0063940 A1* | 3/2009 | Yen | H03M 13/4146 |
| | | | 714/E11.007 |
| 2009/0213908 A1* | 8/2009 | Bottomley | H04L 25/03292 |
| | | | 375/233 |
| 2010/0316112 A1* | 12/2010 | Huang | H04L 25/03057 |
| | | | 375/233 |
| 2022/0302951 A1* | 9/2022 | Pandita | H04L 25/0272 |
| 2025/0055669 A1* | 2/2025 | Verbeke | H04L 7/0029 |
| 2025/0055735 A1* | 2/2025 | Graumann | H04L 25/03229 |

OTHER PUBLICATIONS

Yukui Yu, et al., "Reduced-state MLSE for an IM/DD system using PAM modulation", vol. 28, No. 26/Dec. 21, 2020 | Optics Express 38505, 11 pages.

Joachim Hagenauer, et al., "A Viterbi Algorithm with Soft-Decision Outputs and its Applications", German Aerospace Research Establishment (DLR), West Germany, CH2682-3/89/0000-1680, 1989, IEEE, pp. 1680-1686.

\* cited by examiner

```
// soft trace-back
int illr;
for (i = 6; i <= 25; i ++)
{
        illr = soft[i];
        if (illr < VIT_THRSH)
        {
                for (j = 1; j <= 6; j ++)
                {
                        if ((rxx0[i-j] != rxx1[i-j]) && ((i-j) > 5))
                        {
                                if (illr < soft[i-j])
                                        soft[i-j] = illr;
                        }
                        else
                                break;
                }
        }
}
for (i = 45; i >= 26; i--)
{
        illr = soft[i];
        if (illr < VIT_THRSH)
        {
                for (j = 1; j <= 6; j++)
                {
                        if ((rxx0[i+j] != rxx1[i+j]) && ((i+j) <46))
                        {
                                if (illr < soft[i+j])
                                        soft[i+j] = illr;
                        }
                        else
                                break;
                }
        }
}
```

FIG. 8

SOFT INFORMATION GENERATION FOR CONCATENATED FORWARD ERROR CORRECTION IN DIGIRAL SIGNAL PROCESSING

FIELD OF INVENTION

The subject technology is directed to a method and system for digital signal processing.

BACKGROUND OF THE INVENTION

In the realm of high-speed serial data communication, achieving 200 Gbps per lane in a SerDes (Serializer/Deserializer) design represents a significant engineering challenge, necessitating not just raw speed but also sophisticated techniques to ensure signal integrity and reliability over the communication channel. A concatenated Forward Error Correction (FEC) scheme may be able to enhance the capability to correct errors and thus improve the overall bit error rate (BER) performance, which is desired for achieving such high data rates reliably. The concatenated FEC scheme involves using two (or more) layers of FEC codes, typically with an inner code closely integrated with the physical layer to address the noise characteristics of the channel and an outer code to correct errors that slip past the inner code. This layered approach allows for a more robust correction capability, as different types of FEC codes can be optimized for different aspects of the error profile experienced in high-speed data transmission.

The generation of soft information for the inner code is a cornerstone of this architecture, particularly in environments where signal-to-noise ratio (SNR) is a limiting factor. Soft information refers to probabilistic information about the received symbols, rather than hard decisions that simply categorize symbols as '0' or '1'. This probabilistic information significantly enhances the error correction capabilities of the FEC scheme. Maximum Likelihood Sequence Estimation (MLSE) is a decoding technique that makes use of the known characteristics of the channel and the transmitted signal to estimate the most likely sequence of transmitted symbols before decoding the symbols in a digital signal decoder. Therefore, it is desired to have a method and system for generating soft information of MLSE to provide detailed probabilistic information about each symbol's likelihood.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

FIG. 8 is a piece of pseudo code on how to implement soft information trace back for each 40-sample engine demonstrated in FIG. 7 according to an embodiment of the subject technology.

DETAILED DESCRIPTION OF THE INVENTION

The subject technology provides a method and system for generating soft information of MLSE process for a digital signal decoder. The method includes processing a first plurality of signals to calculate path metric values for generating each of a second plurality of most-likely symbols by hard decisions and intermediate information for a most-likely path and a second-likely path at each specific point in time, i.e., time index, determined by a signal clock. The method includes computing a difference between the most-likely path and a second-likely path for a given state 0 or 1 at each time index. The method also includes determining a soft information corresponding to either state 0 or 1 at the time index per one of the second plurality of most-likely symbols. There are other embodiments as well.

In some embodiments, the subject technology provides a method for generating soft information of MLSE process within a concatenated FEC scheme for achieving 200 Gbps or more per lane in SerDes designs. This soft information of MLSE captures nuances in the received signal that hard decisions would miss, allowing the inner FEC code to more accurately correct errors based on the confidence level of each bit's value. In high-speed data transmission like a 200 Gbps per lane SerDes (Serializer/Deserializer) system, the term "symbol" or "coding symbol" represents a discrete unit of information conveyed by a specific state or configuration of the communication signal over a defined interval of time or space. For instance, in binary modulation schemes, each symbol represents a single bit (0 or 1), whereas in more complex modulation schemes like QAM (Quadrature Amplitude Modulation) or PAM-4 (Pulse Amplitude Modulation with 4 levels), each symbol can represent multiple bits. In a 200 Gbps system, the use of multi-bit-per-symbol schemes is often necessary to achieve the required data rates within the available bandwidth. Symbols are the result of the modulation process, where bits of digital data are encoded into specific states of the signal such as amplitude, phase, or frequency variations. This encoding facilitates the efficient use of the communication medium, allowing for the transmission of high data rates over physical channels. In systems employing FEC code, the ability to correct errors at the symbol level—recognizing when a received symbol has been distorted due to noise, interference, or channel imperfections, and then deducing the original intended symbol—is fundamental to maintaining high fidelity in data transmission.

Figure 1:
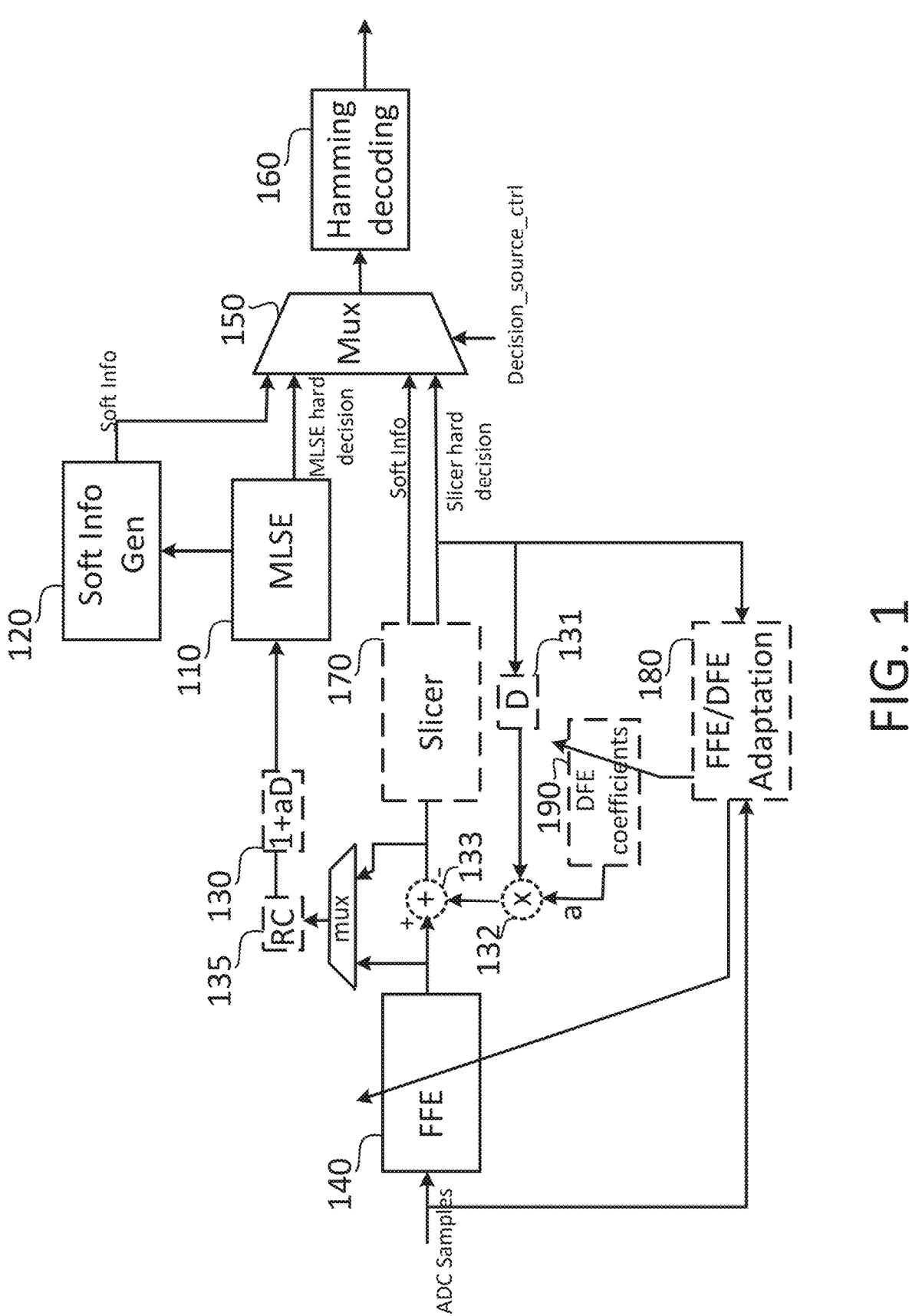
FIG. 1 is a block diagram of a system for generating soft information of a maximum likelihood sequential estimation (MLSE) process for a digital signal decoder according to an embodiment of the subject technology.

FIG. 1 is a block diagram of a system for generating soft information of MLSE process for a digital signal decoder according to an embodiment of the subject technology. As shown, the MLSE block 110 is configured to receive filtered FFE (Feed-Forward Estimation) outputs as MLSE inputs. FFE 140 is a linear equalizer used to mitigate intersymbol interference (ISI) that occurs in communication channels. ISI is a form of distortion where symbols interfere with subsequent symbols, making it difficult to distinguish between them at the receiver. FFE works by applying a filter to the received signal from the analog-to-digital converter, attempting to construct a signal that counteracts the effects of ISI based on the known characteristics of the channel. It operates by "feeding forward" the received signals through a series of taps (e.g., weights), which are adjusted to minimize the effects of ISI. Before making any decisions about the data, FFE uses only past and current received symbols to form its output, without considering future symbols.

In an embodiment, the outputs of the FFE 140 are further processed by a filter (or filtering/reshaping system) to further shape the signals (e.g., the FFE outputs) for improved performance, particularly in mitigating ISI and optimizing the signals to produce digital inputs for subsequent processing blocks, such as a MLSE block 110 and Hamming decoder. In a specific implementation, the filter may include a reflection canceller (RC) 135 for signal shaping followed by a finite impulse response filter 130, denoted as (1+aD) to apply a specific correction to the signal based on the symbol immediately following the current one to further optimize the signals as inputs for MLSE 110. RC135 can be included or optionally by-passed. The (1+aD) filter 130 may be implemented in some alternated ways. For example, the filter 130 may be completely removed or not placed after the RC 135, instead, it can be implemented together with an adaptation engine in an adaptive equalizer loop. Note, FIG. 1 uses some blocks shown in dashed lines to schematically illustrate some optional topologies of the system for performing multi-tap filtering combining feed-forward and decision-backward equalization as well as various other digital processing techniques. Specific implementations may be depended on tradeoff between design complexity and performance.

MLSE block 110 takes a series of MLSE inputs produced by the RC 135 and filter 130 (in one possible embodiment) and generates hard decision (e.g., PAM4) coding symbols respectively for a plurality of time indices (there are two states 0 or 1 for each time index corresponding to each MLSE input). In an example, the system includes two MLSE blocks. Only one MLSE block is shown in FIG. 1 for simplicity. Each MLSE block 110 works at the 112.5 GHZ/160 clock (called Clock 160), taking 80×2 samples per clock and having two computational engines to generate two 40 PAM4-symbols by hard decisions. Each computational engine has two process blocks: a forward process block for 6+20 MLSE inputs and a backward process block for another 20+6 MLSE inputs, where 6 MLSE inputs are used for forward/backward path metric warm-up calculations. The path-metric warm-up calculations are used to establish initial values and stabilized metrics that guide signal path decisions. When a system starts up or a new component is integrated, initial metrics may not be reflective of the true or steady-state conditions due to transient behaviors or lack of sufficient data. Warm-up calculations provide a method to gradually adjust these metrics to more stable and accurate values. By considering the sequence of received symbols and the characteristics of the communication channel, it aims to find the sequence of transmitted symbols that is most likely to have resulted in the observed sequence of received symbols, using the Viterbi algorithm (or similar algorithms) to determine the most likely sequence of transmitted symbols. Thus, the middle 40 (path metrics)=20 (forward)+20 (backward) MLSE inputs will generate 40 MLSE hard decision coding symbols (e.g., coding symbols determined by hard decisions). Each hard decision coding symbol refers, for example, to each bit or symbol obtained by making hard decision based on a threshold (e.g., if the received signal is above a certain level, interpret it as a 1; otherwise, interpret it as a 0).

Along with MLSE hard decision coding symbols at respective time indices, four pieces of intermediate information are also generated by the MLSE block 110 in each time index: (a) the most-likely current state (survival state) being at state 0, which is a 2-bit register in terms of a PAM4 symbol in the MLSE block; (b) the most-likely path (survival path) coming from previous state 0 or state 1 to current state 0, which is an 1 bit register in the MLSE block; (c) the most-likely current state being at state 1, 2-bit register; (d) the most-likely path coming from previous state 0 or state 1 to current state 1, 1 bit register. Then, a Soft Information Generator (block) 120 of the system uses at least the four pieces of intermediate information to create soft information which will be used for inner code decoding. Soft information refers to the use of probabilistic information or confidence levels about the received bits or symbols, rather than just making a hard decision on their values (0 or 1 in binary systems). This approach leverages the fact that the received signal contains more information about each transmitted bit or symbol than just its most likely value. By using soft information, the decoder considers the likelihood or confidence level of each bit or symbol being a 1 or a 0. This is often represented as a likelihood ratio, log-likelihood ratio (LLR), or simply the amplitude of the received signal. Soft decoding retains the information about how close the signal was to the threshold, improving its error correction performance, especially in noisy environments.

Alternatively, the system may include a slicer 170 to make immediate, "hard" decisions on the value of each received symbol (i.e., the FFE outputs) based on a thresholding operation. In the case of PAM4, which has four distinct amplitude levels representing two bits per symbol, the slicer divides the range of received signal amplitudes into four regions, each corresponding to one of the PAM4 symbols (00, 01, 10, 11). When a symbol is received, the slicer determines which region the symbol's amplitude falls into and thus decides on the symbol's value. Optionally, some systems might equip the slicer with the capability to measure how close the received signal is to each decision boundary, which can be interpreted as a form of soft information. For example, the distance from the received signal to the nearest constellation points can be used to infer the likelihood or confidence level of each symbol decision. LLRs or other probabilistic metrics can be calculated based on the received signal's characteristics. These metrics provide a quantitative measure of confidence in each bit or symbol decision, serving as soft information. As shown in FIG. 1, the hard decision and soft information for Hamming decoding 160 (e.g., using a Chase-type algorithm) can be selected from slicer output or MLSE output by a control bit (DECI-SION_CTRL). The subject technology focuses on how to generate soft information from MLSE block 110 based on every MLSE input from the filtered FFE output. However, storing the entire soft information of inner code codewords is expensive and not necessary. Chase-type algorithm is configured to use the MLSE soft information to just find out p least reliable bits per codeword instead of storing all bits in each codeword. Based on the design of inner code decoding engine in the subsequent digital signal decoder, one can tailor the storage of soft information to reduce complexity.

In some embodiments, in high-speed digital communication systems, particularly those employing advanced modulation schemes like PAM4 and complex error correction codes, an adaptation engine 180 is employed for optimizing performance across various components from the FFE 140 and the subsequent MLSE block 110. The adaptation engine 180 analyzes the output from the FFE 140, along with feedback from the MLSE block 110 in an adaptive equalizer loop, to dynamically adjust the FFE taps. This adjustment is aimed at minimizing ISI and other linear distortions based on the current channel conditions, which can vary due to temperature changes, equipment aging, or other environmental factors. Also, the adaptation engine 180 fine-tunes the MLSE parameters, such as branch metrics used for sequence estimation, to enhance its decoding performance. In systems that support both hard and soft decision decoding, the adaptation engine 180 decides the optimal strategy to use based on current conditions and continuously monitors the system's performance, including error rates and signal quality metrics, to adapt the decoding process dynamically.

There are various possible topologies to implement the adaptation engine 180 in relevant system architecture. FIG. 1 uses dashed or dotted lines to illustrate the optional function blocks for one embodiment of the system. For example, the adaptation engine 180 is adjusting FFE coefficients based on channel characteristics to mitigate ISI caused by linear channel impairments within the constraints of the FFE architecture. FFE taps are usually designed to combat pre-cursor ISI. The FFE adaptation engine 180 would specially optimize the taps to align the signals more accurately. In another example, the adaptation engine 180 further includes adjustment of decision-feedback equalizer (DFE) coefficients 190 to try to eliminate post-cursor ISI based on error feedback from previously decoded symbols. DFE adaptation 180 includes non-linear equalization that must account for the quality of these decisions by adjusting (multiple) DFE taps. For DFE adaptation with multiple taps, the adaptation engine has more parameters to optimize. Each tap corresponds to a different time delay in the received signal, and the engine must adjust each tap's weight to minimize the impact of ISI from multiple previous symbols. The combined adaptation of FFE and DFE can handle a wider range of channel conditions, including those with significant post-cursor ISI, leading to better overall system performance. In this approach, the delay operator D 131, the multiplier 132 (to multiply factor a), and the adder 133 are reconfigured between the FFE 140 and the FFE/DFE adaptation engine 180 to prepare the MLSE inputs for the MLSE block 110. Particularly, the MLSE inputs are optimized through the FFE/DFE adaptation in the adaptive equalizer loop. The optimized MLSE inputs may involve at least direct adjustment of FFE 140 or multiplex of FFE outputs with filtered outputs based on FFE adaptation, DFE non-linear tapping, etc. in the adaptive equalizer loop.

The whole system architecture for generating filtered FFE outputs as optimized MLSE inputs for the subsequent MLSE process can vary but would not alter the implementation of the subject technology to provide soft information of MLSE for concatenated Forward Error Correction in 200G/lane Serdes design. In other words, the method and system described herein should covers all possible topologies to implement the filter or the adaptation engine.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the exemplary embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein or illustrated herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude the possibility of other examples in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect of the subject technology includes method for generating soft information for a digital signal decoder. The method includes receiving a first plurality of signals from a filter, each of the plurality of signals corresponding to a symbol at a time index determined by a signal clock, each time index being associated with two states including state 1 and state 0, each state corresponding to two bits in terms of the symbol. The method also includes processing the first plurality of signals to calculate path metric values of state 0 and state 1 for generating each of a second plurality of most-likely symbols by hard decisions and intermediate information for a most-likely path and a second-likely path through each time index. The method also includes computing a difference between the most-likely path and the second-likely path to obtain a delta value for a given one of the two states at each time index. The method also includes determining a soft information for the digital signal decoder at each time index corresponding to one of the second plurality of most-likely symbols based on the delta value and the intermediate information. Other embodiments of this aspect include corresponding signal processing systems, apparatus, and computation programs recorded on one or more storage devices, each configured to perform the actions of the methods.

Implementations may include one or more of the following features. The method for determining the soft information may include assigning the delta value for a given one of the two states at each time index as the soft information at the corresponding time index if a soft information trace-back mode is set off. The method may include revising the soft information for a selected time index if the delta value is less than a programmable threshold and the soft information trace-back mode is enabled. Receiving the first plurality of signals may include filtering the signals based on outputs from a feed-forward equalizer. Processing the first plurality of signals may include using a first part of the first plurality of signals for warm-up calculation of the path metric values and using a second part of the first plurality of signals for generating the second plurality of most-likely symbols by hard decisions based on a maximum likelihood sequence estimation (MLSE) process. Processing the first plurality of signals may include generating the intermediate information for each time index including the most-likely current state being state 0, the most-likely path and second-likely path to current state 0 coming from previous state 0 or state 1, the most-likely current state being state 1, and the most-likely path and second-likely path to current state 1 from previous state 0 or state 1. Computing a difference between the most-likely path and the second-likely path to obtain a delta value for current state 0/1 at each time index may include calculating an absolute value of a difference between a path metric value from state 0/1 at a previous time index to the current state 0/1 at the time index and a path metric value from state 1/0 at a previous time index to the current state 0/1 at the time index. The method may include using the soft information in a Chase-type algorithm for inner code decoding. Implementations of the described techniques may include hardware, a method or process, or computation software or firmware programmed on a computation medium.

Another general aspect of the subject technology includes a method for generating soft information at each time index from a maximum likelihood sequence estimation (MLSE) process for a digital signal decoder. The method also includes accumulating path metric values for a first plurality of time indices from a first index forward to a middle index and from a last index backward to the middle index, each time index corresponding to a coding symbol. The method also includes generating two sets of first delta values for respective two optional states at each time index from the first index forward to the middle index and two sets of second delta values for respective two optional states at each time index from the last index backward to the middle index. The method also includes determining a most-likely state at the middle index. The method also includes tracing backward from the most-likely state at the middle index to the first index to determine a first half of a second plurality of coding symbols by hard decisions. The method also includes tracing forward from the most-likely state at the middle index to the last index to determine a second half of the second plurality of coding symbols by hard decisions. The method also includes assigning one of the first delta values as soft formation for one of the two optional states at first half of the first plurality of time indices corresponding to each coding symbol determined by hard decision during tracing backward and one of the second delta values as soft information for one of the two optional states at second half of the first plurality of time indices corresponding to each coding symbol determined by hard decision during tracing forward. Other embodiments of this aspect include corresponding signal processing systems, apparatus, and computation programs recorded on one or more computer devices, each configured to perform the actions of the methods.

Implementations may include one or more of the following features. Accumulating the path metric values may include calculating a first branch metric value between state 0 at time index n and state 0 at time index n+1; adding the first branch metric value to a path metric value of state 0 at time index n to obtain a first path metric value from state 0 at time index n to state 0 at time index n+1; calculating a second branch metric value between state 1 at time index n and state 0 at time index n+1; adding the second branch metric value to a path metric value of state 1 at time index n to obtain a second path metric value from state 1 at time index n to state 0 at time index n+1; and assigning a minimum one of the first path metric value and the second path metric value as a forward path metric value of state 0 at time index n+1, where n is initialized from 0 and increased to the middle index with an increment of 1. Accumulating the path metric values also may include calculating a third branch metric value between state 0 at time index n and state 1 at time index n+1; adding the third branch metric value to a path metric value of state 0 at time index n to obtain a third path metric value from state 0 at time index n to state 1 at time index n+1; calculating a fourth branch metric value between state 1 at time index n and state 1 at time index n+1; adding the fourth branch metric value to a path metric value of state 1 at time index n to obtain a fourth path metric value from state 1 at time index n to state 1 at time index n+1; and assigning a minimum one of the third path metric value and the fourth path metric value as a forward path metric value of state 1 at time index n+1, where n is initialized from 0 and increased to the middle index with an increment of 1. Accumulating the path metric values also may include calculating a backward path metric value of state 0 at time index n−1 based on two path metric values respectively from state 0 and state 1 at time index n to state 0 at time index n−1 and a backward path metric value of state 1 at time index n−1 based on two path metric values respectively from state 0 and state 1 at time index n to state 1 at time index n−1, where n is initialized from the last index and decreased to the middle index with a decrement of 1. Determining a most-likely state at the middle index may include adding the forward path metric value of state 0 at the middle index to the backward path metric value of state 0 at the middle index to obtain a path metric value of state 0 at the middle index; adding the forward path metric value of state 1 at the middle index to the backward path metric value of state 1 at the middle index to obtain a path metric value of state 1 at the middle index; and determining the most-likely state at the middle index to be state 0/1 if the path metric value of state 0 is smaller/greater than the path metric value of state 1. The method may include finding an absolute value of a sum of the forward path metric value of state 0 at the middle index plus the backward path metric value of state 0 at the middle index minus the forward path metric value of state 1 at the middle index minus the backward path metric value of state 1 at the middle index; assigning the absolute value as a soft information of the middle index. The condition is enabled or disabled by setting a register value to 1 or 0 in MLSE. Generating the two sets of first delta values may include finding an absolute value of a difference between the two path matric values respectively from state 0 and state 1 at time index n to state 0 at time index n−1, and an absolute value of a difference between the two path matric values respectively from state 0 and state 1 at time index n to state 1 at time index n−1, where n is initialized from the last index and decreased to the middle index with a decrement of 1. Generating the two sets of first delta values may include finding an absolute value of a difference between the first path metric value and the second path metric value for a survival state 0 from each time index n to n+1, and an absolute value of a difference between the third path metric value and the fourth path metric value for a survival state 1 from each time index n to n+1, where n is initialized from 0 and increased to the middle index with an increment of 1. The method may include using the soft information obtained for the second plurality of time indices around the middle index for inner code decoding of the corresponding second plurality of coding symbols in the digital signal decoder. Implementations of the described techniques may include hardware, a method or process, or computation software firmware on a computation medium.

Yet another general aspect of the subject technology includes an apparatus for generating soft information of a maximum likelihood sequence estimation (MLSE) process. The apparatus also includes a feed-forward equalizer receiving signals to produce equalized outputs. The apparatus also includes a filter coupled to the feed-forward equalizer in an adaptive equalizer loop to provide MLSE inputs at a series of time indices based on filtering adaptation of the equalized outputs. The apparatus also includes a MLSE block configured to process the MLSE inputs to generate hard decision coding symbols and intermediate path metric information for the series of time indices. The apparatus also includes a soft information generator configured to generate soft information corresponding to each hard decision coding symbol at each of the series of time indices based on the intermediate path metric information. The apparatus also includes a multiplexer combining the soft information and the hard decision coding symbols. The apparatus also includes a decoder configured to use the soft information for inner code decoding of the corresponding coding symbols. The apparatus may further include: a saturation block in a channel following the soft information generator to saturate each 10-bits soft information to v-bits data; a channel interleaver to split the v-bits data to m codewords; each codeword including 64 PAM4 symbols and m sorting blocks following the channel interleaver to generate and store p least reliable symbols from each of the m codewords; where the number m ($m>1$), v ($v<10$), and p ($p<m\times64$) are selected based on design complexity and performance tradeoff.

Figure 2:
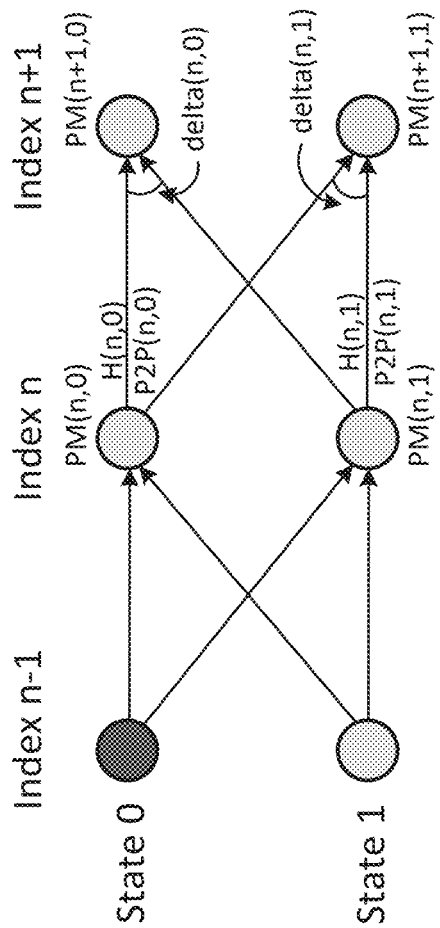
FIG. 2 is a schematic diagram illustrating generation of path metric delta values for each time index according to an embodiment of the subject technology.

In an embodiment, the generation of MLSE soft information contains three steps: (1) Step 1: Compute the difference between a most-likely (ML) path and second-likely path called delta for a given state at a certain time index. (2) Step 2: During a MLSE hard decision trace back procedure, while choosing a hard decision coding symbol of MLSE, the soft information delta value at each time index will also be determined in the meantime. (3) Step 3: if SOFT_TRACE_MODE=1, and delta corresponding to the selected hard decision is less than a programmable threshold, DELTA_THRSH, then a soft information trace-back operation will be conducted to revise or update the soft information obtained in Step 2 by simply assigning soft information delta at certain time index. Step 3 can be turn on and off by setting register code SOFT_TRACE_MODE. FIG. 2 is a schematic diagram illustrating generation of path metric delta values for each time index according to an embodiment of the subject technology. For three sequential time indices n−1, n, and n+1, path metrics are changing between the state 0 and the state 1 via a so-called branch metric. For example, branch metric (state (n,0), state (n+1,0)) indicates a likelihood for a state 0 at time index n to remain at state 0 at time index n+1. Branch metric (state (n, 1), state (n+1,0)) indicates a likelihood for a state 1 at time index n to change to state 0 at time index n+1. Therefore, a path metric value, referring an accumulated likelihood of the coding symbol in a path from one state to another through a series of time indices, from the state 0 at time index n to the state 0 at time index n+1 can be generally expressed as in an accumulation form:

$$PM_A(n+1, 0) = PM(n, 0) + \text{branch metric}(\text{state}(n, 0), \text{state}(n+1, 0)).$$

And a path metric value from state 1 at time index n to state 0 at time index n+1 can be expressed as $$PM_B(n+1, 0) = PM(n, 1) + \text{branch metric}(\text{state}(n, 1), \text{state}(n+1, 0)).$$

Similarly, we have another two path metric values:

$$PM_A(n+1, 1) = PM(n, 0) + \text{branch metric}(\text{state}(n, 0), \text{state}(n+1, 1))$$

$$PM_B(n+1, 1) = PM(n, 1) + \text{branch metric}(\text{state}(n, 1), \text{state}(n+1, 1)).$$

Therefore, a ML path metric value for state 0 at time index n+1 can be obtained by taking a minimum value of $PM_A$(n+1, 0) and $PM_B$(n+1,0), i.e., $$PM(n+1, 0) = \min(PM_A(n+1, 0), PM_B(n+1, 0)).$$

And a ML path metric value for state 1 at time index n+1 can be obtained by taking a minimum value of $PM_A$(n+1, 1) and $PM_B$(n+1, 1), i.e., $$PM(n+1, 1) = \min(PM_A(n+1, 1), PM_B(n+1, 1)).$$

Accordingly, the second-likely path metric value in each of above two cases would be the one with a larger value among the corresponding pair of $PM_A$ and $PM_B$. At the same time, two delta values, delta (n, 0) and delta (n, 1), are generated by taking an absolute value of a difference between the two path metric values, i.e., between the ML path and second-likely path, for each given state, one for state 0 and another for state 1, at a certain time index:

$$\text{delta}(n, 0) = \text{abs}(PM_A(n+1, 0) - PM_B(n+1, 0))$$

$$\text{delta}(n, 1) = \text{abs}(PM_A(n+1, 1) - PM_B(n+1, 1)).$$

The ML path, also called a survival path, indicates a path leading to a current (or survival) state (or symbol) at a given time index n+1 with most likelihood from one of previous states at time index n. The second-likely path refers to a path leading to the current state at time index n+1 with less likelihood from (another) one of the previous states at the time index n. If the state represents a binary choice of 0 or 1, there are only one second-likely path following the most-likely path. If the state refers to a symbol with four levels, then there can be a third-likely path and a fourth likely path from a previous state to the current state or survival state. For a path over more time indices, the ML path is referred as an accumulated one of the above ML path from one time index to subsequent next time index. Accordingly, a hard decision will be applied to choose a symbol corresponding to the survival state. Here in a simplified version, a symbol is referred to just two states: 0 and 1. If state 0 is the survival path at time index n+1, the symbol corresponding to state 0 will be chosen as a hard decision coding symbol (by the MLSE process). In this case, delta (n, 0) will be recorded as soft information (denoted as soft (n)) for this hard decision coding symbol. Otherwise, delta (n, 1) will be recorded as soft information soft (n) for hard decision corresponding to state 1. Additionally, the Soft Information Generator block 120 is configured with a soft information trace-back which is enabled by setting a register parameter (SOFT_TRACE_MODE) to 1 and determining that the delta value corresponding to the selected symbol by hard decision is less than a programmable threshold, DELTA_THRSH. The soft information trace-back is to extend the hard decision process by considering the probabilities or confidences of each symbol's value rather than just the ML path. The algorithm maintains a distribution of probabilities or confidence levels for each possible symbol at each state. The algorithm doesn't simply choose the path with the best path metric. Instead, it calculates the likelihood of each symbol being a state 1 or a state 0 (in the case of binary symbols) based on the accumulated soft metrics, a P2P information for state 0 and state 1 for each time index which tells that from which previous state (path) the current state 0 and state 1 come from. The soft information trace-back mode can be turned off by setting the register parameter SOFT_TRACE_MODE=0. In other words, by default, the soft information is the delta value obtained for each time index.

Figure 3:
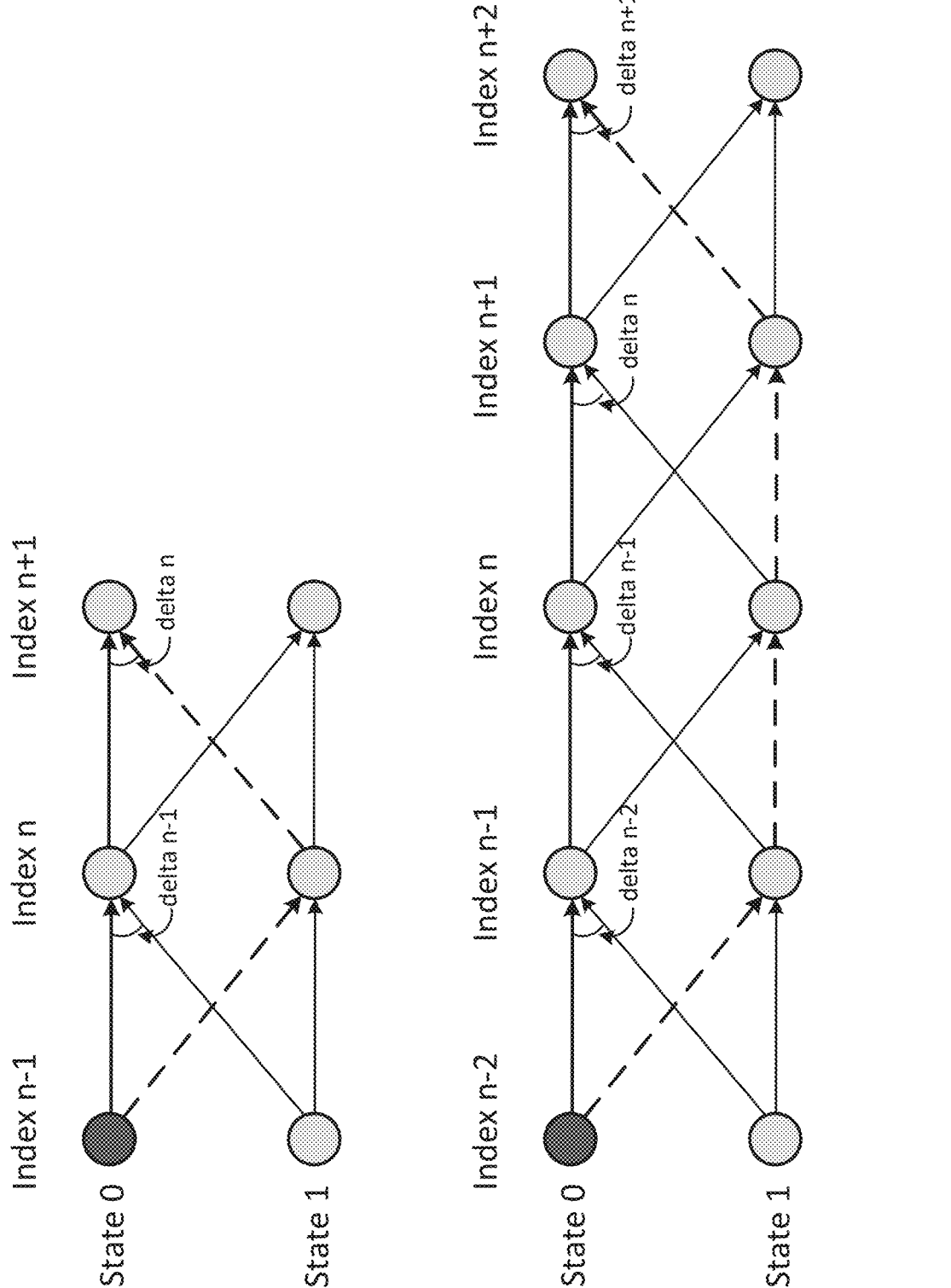
FIG. 3 is a schematic diagram illustrating examples of most-likely path and second-likely path and soft information trace back according to an embodiment of the subject technology.

FIG. 3 is a schematic diagram illustrating examples of most-likely path and second-likely path and soft information trace back according to an embodiment of the subject technology. In a first example, the ML path is from state 0 at time index n−1 to state 0 at time index n to state 0 at time index n+1. The second-likely path is from state 0 at time index n−1 to state 1 at time index n to state 0 at time index n+1. Since at time index n, state 0 and state 1 come from the same previous state (state 0 at time index n−1), no soft information update by trace-back is needed for delta (n−1) at time index n−1. In another example, the ML path for state 0 at time index n+2 is from state 0 at time index n−2 all the way to the state 0 at time index n+2, while second-likely path is starting from state 0 at time index n−2 then changing to state 1 at time index n−1, and so on till state 1 at time index n+1. At the end of the second-likely path, it merges back to state 0 at time index n+2. In this case, if the survival path soft information, delta (n+1), is smaller than the preprogrammed threshold value DELTA_THRSH, then the soft information for time index n+1 and n need to be compared with delta (n+1). If any of them is larger than delta (n+1), then need to change that soft information to be same as delta (n+1).

Figure 4:
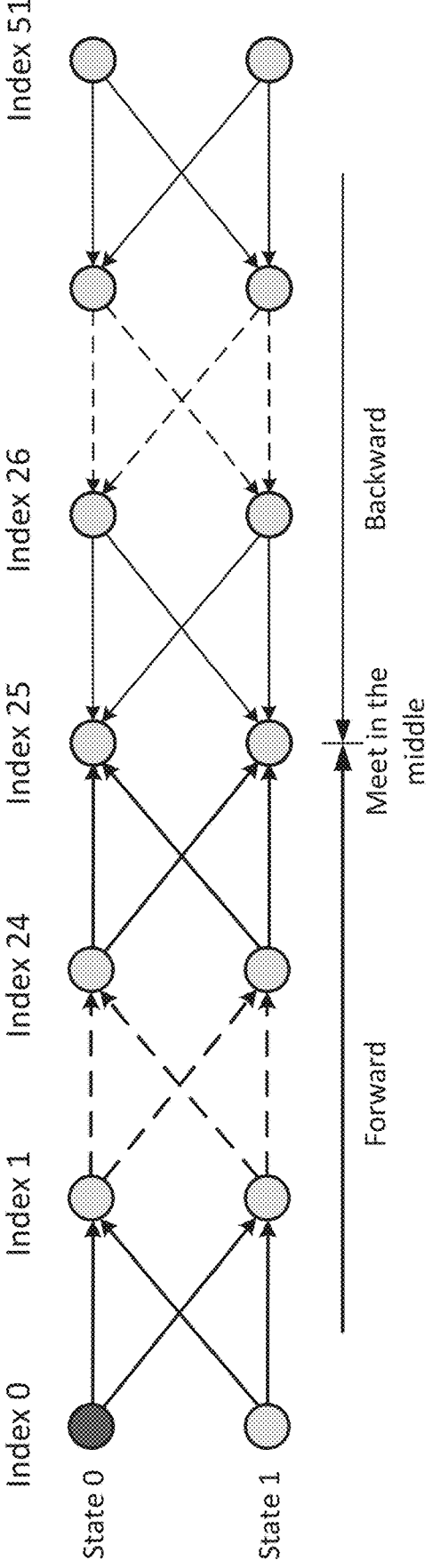
FIG. 4 is a schematic diagram illustrating a forward-backward MLSE process according to an embodiment of the subject technology.

FIG. 4 is a schematic diagram illustrating a forward-backward MLSE process according to an embodiment of the subject technology. In a specific embodiment, FIG. 4 shows a unique way to conduct soft information generation from the MLSE process. In an example, the process is started by accumulating path metric values for each time index from both ends (i.e., first time index 0 and last time index 51) for a MLSE block taking 80 samples per clock in two computational engines to generate two sets of 40 PAM4-symbols by hard decisions. Please note, the MLSE process may be operated over a series of time indices from first time index 0 to a last time index tx, where length of the series of time indices (represented by tx) can be varied and not limited to specific number like 51. The claims herein based on these examples should not be limited to specific number for the length of the series of time indices. In an embodiment, the accumulating path metric values is a forward-backward MLSE process. In an example, the forward MLSE process starts from time index 0 via 6 forward warm-up symbols (at indices 0 to 5) to go through further 20 forward symbols (at indices 6 to 25). The back MLSE process starts from time index 51 via 6 backward warm-up symbols (at time indices 51 to 46) to go through further 20 backward symbols (at time index 45 to 26). Then, the process includes meeting in the middle (of the series of time indices) to determine the survival node (i.e., a survival state at a given time index) at the middle time index (i.e., time index 25). Finally, the MLSE process goes from the survival node at middle (time index) to trace back to both ends to find out total 40 PAM4 symbols by MLSE hard decisions.

Figures 5, 6:
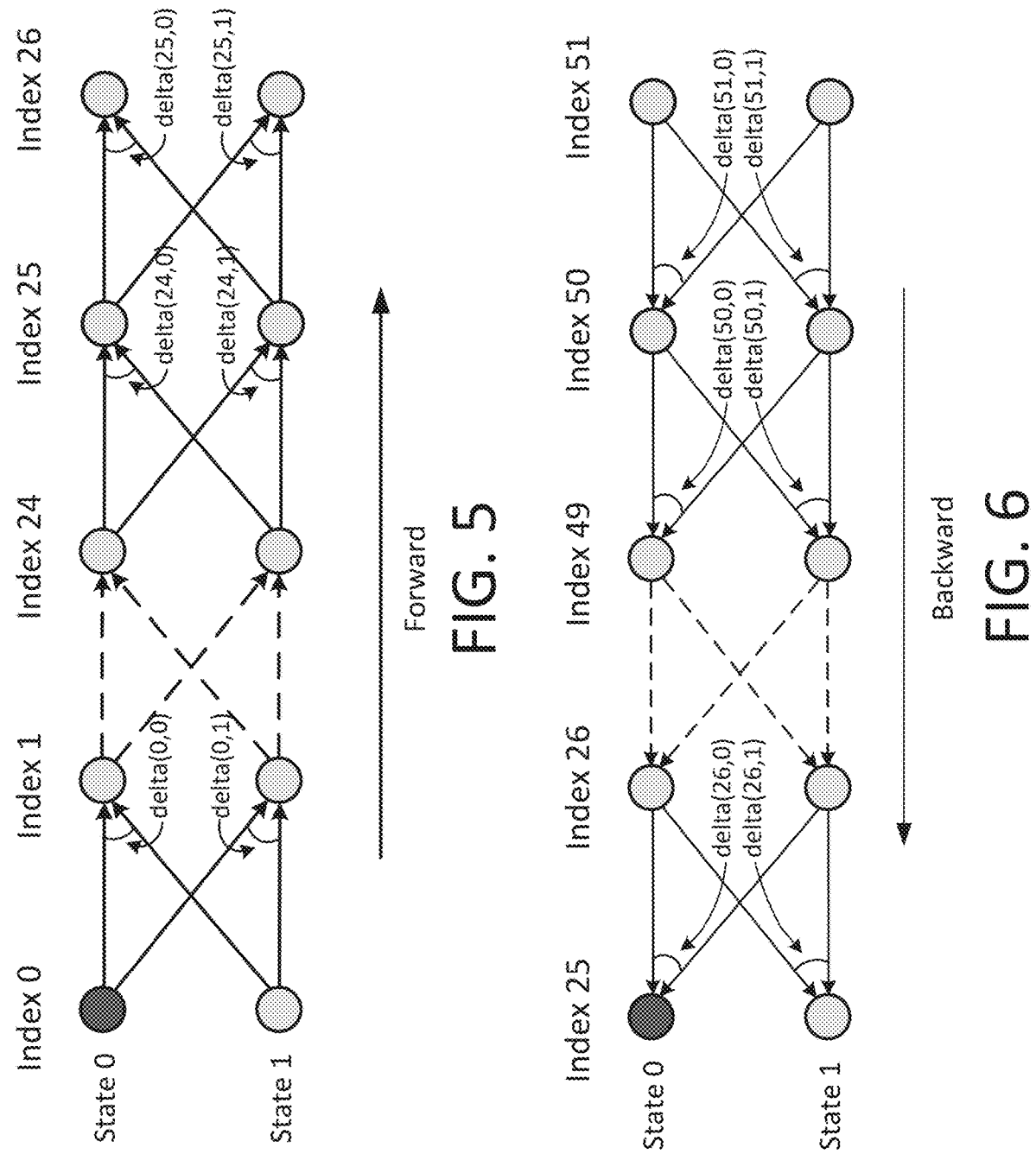
FIG. 5 is a schematic diagram illustrating a forward step to compute delta values for each time index according to an embodiment of the subject technology.
FIG. 6 is a schematic diagram illustrating a backward step to compute delta values for each time index according to an embodiment of the subject technology.

FIG. 5 is a schematic diagram illustrating a forward step to compute delta values for each time index according to an embodiment of the subject technology. As shown in the forward MLSE process from time index 0 to the middle time index 25, path metric values, PM, are computed in an accumulation manner from time index 0 to the middle time index 25 using the equations shown above in the descriptions for FIG. 2. This accumulation computation ends with a PM0_forward and PM1_forward values for state 0 and state 1 at the middle time index 25. At the same time, the delta values are obtained as well for time indices 0 to 26, one more comparing path metric value computation, as it is shown in last portion of the forward path in FIG. 5. For example, for time index 1, delta (0, 0) is obtained by taking minimum value among the two path metric values from state 0 or 1 at time index 0 to state 0 at time index 1. delta (0,1) is obtained by taking minimum values of the two path metric values from state 0 or 1 at time index 0 to state 1 at time index 1. For example, for time index 26, delta (25, 0) is obtained by taking minimum value among the two path metric values from state 0 or 1 at time index 25 to state 0 at time index 26. delta (25,1) is obtained by taking minimum values of the two path metric values from state 0 or 1 at time index 25 to state 1 at time index 26.

FIG. 6 is a schematic diagram illustrating a backward step to compute delta values for each time index according to an embodiment of the subject technology. In the example shown in FIG. 6 about the backward MLSE process from the last time index 51 to the middle time index 25, path metric values, PM, are computed in an accumulation manner from time indices 51 to 25 using the equations shown above in the descriptions for FIG. 2. This accumulation computation ends with PM0_backward and PM1_backward values for state 0 and state 1 at time index 25. At the same time, the delta values are obtained as well for time indices 51 to 26, one more comparing path metric value computation. For example, for time index 25, delta (26, 0) is obtained by taking minimum value among the two path metric values from state 0 or 1 at time index 26 to state 0 at time index 25. Therefore, the meeting in the middle process is realized by adding the PM_forward/backward values at time index 25 to determine whether the survival node and path at the middle time index (25) is state 0 or state 1. In this forward-backward MLSE process, the soft information of the middle time index 25 can be assigned by abs (PM0_forward+PM0_backward-PM1_forward-PM1_backward).

Figure 7:
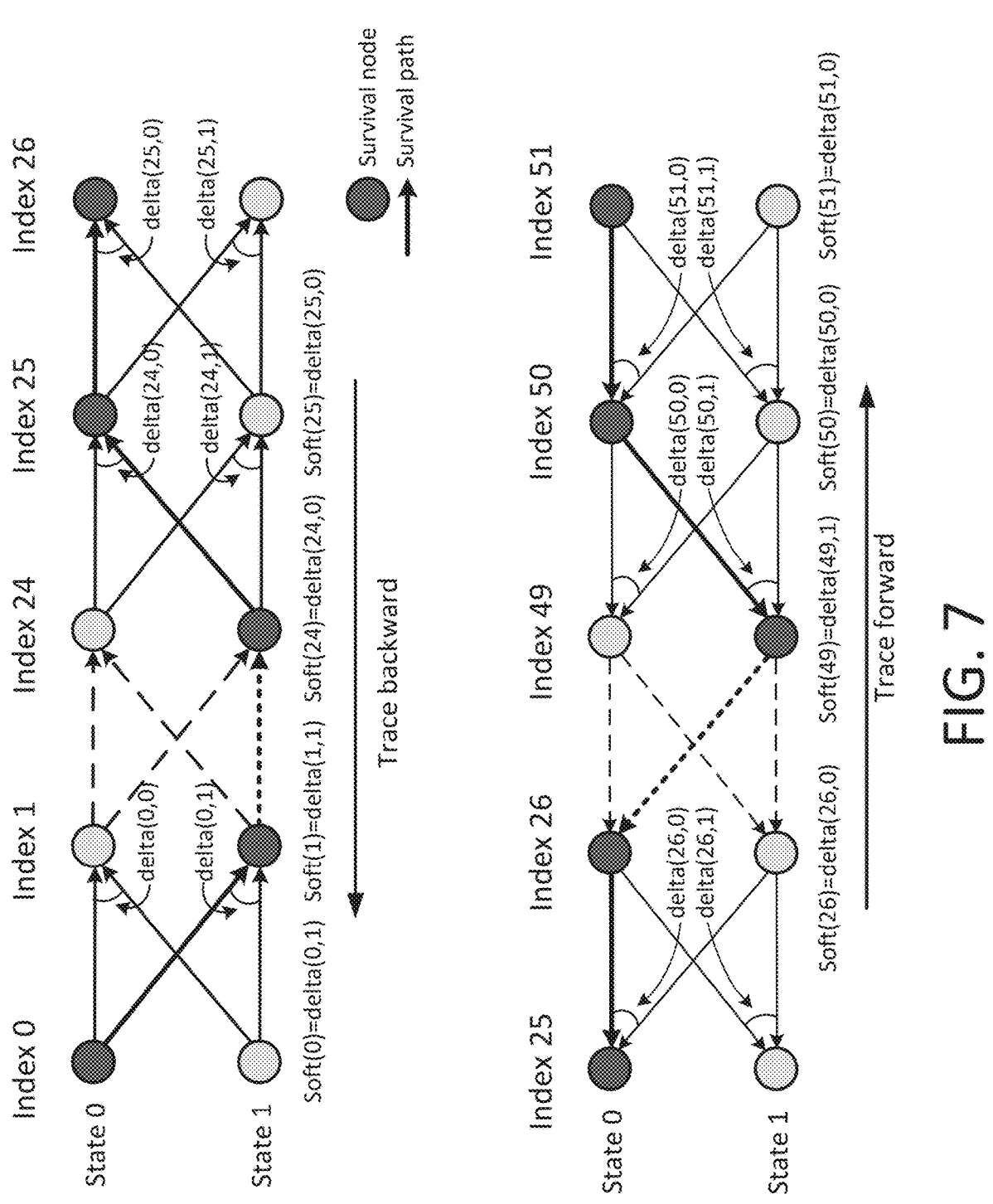
FIG. 7 is a schematic diagram illustrating the generation of soft information during a hard decision trace back procedure according to an embodiment of the subject technology.

After the survival node and path at the middle time index 25, trace-back in both directions are proceeded to find hard decision coding symbols of MLSE process and soft information for each time index 0 to 51. FIG. 7 is a schematic diagram illustrating generation of soft information during a hard decision trace back procedure according to an embodiment of the subject technology. In the example shown in FIG. 7, the survival node at index 26 is state 0 with a previous survival path from state 0 at time index 25. Thus, delta (25,0) is assigned as soft (25) the soft information at time index 25 corresponding to the hard decision coding symbol at this time index. Trace backward operation from the survival node at time index 25, state 0, (along the path with thicker line width) leads to a previous survival node at time index 24 which is state 1, then delta (24,0) is assigned as soft (24) the soft information at time index 24 corresponding to the hard decision coding symbol at this time index. Further trace backward operations would lead to survival nodes for each of the time indices from 24 to 1 at state 1 and further the survival node for time index 0 at state 0, giving delta (1,1) as soft (1) the soft information at time index 1 and delta (0,1) as soft information at time index 0. Please note, all the delta values are calculated based on equations given earlier in descriptions for FIG. 2.

A similar hard decision trace back process can be applied for the other half of the series of time indices. As the survival path was generated using the backward MLSE process from the last time index 51 to the middle index, the hard decision trace back process is to conduct trace forward operations. As the survival nodes at respective time index denoted by the solid dots and the survival path by the lines with thicker line width, the soft information for each respective time index is also generated. For example, soft (26)=delta (26,0), . . . soft (49)=delta (49,1), soft (50)=delta (50,0), and soft (51)=delta (51,0). The hard decision trace back process leads to the generation of all soft information of MLSE for total 52 time indices, as shown in the example, while only soft information for time index 6 to 45 will be used by soft decoding of inner code in next digital signal decoding process (see FIG. 1).

Once the hard decision coding symbol of MLSE (i.e., corresponding PAM4 symbol) and soft information for each time index are obtained, optionally, a soft information trace back may be conducted further depending on the tradeoff between final performance and implementation complexity. Referring back to the Step 3 for generating soft information of MLSE for inner code decoding: if the register parameter SOFT_TRACE_MODE=1, the soft information trace-back mode is enabled, and if the delta value corresponding to the selected symbol by hard decision is less than a programmable threshold, DELTA_THRSH, then a soft information trace-back will be conducted using an algorithm shown in FIG. 8 as a pseudo code. As an example, the pseudo code illustrates a soft decision trace-back procedure, which is a part of a soft-output Viterbi algorithm used in decoding signals in digital communications. A first loop (forward trace-back loop) goes from i=6 to i=25, which suggests that it is operating on a window of the received sequence that has been determined to be relevant for the trace-back process. If the assigned the soft information of the current index i is less than a threshold value that likely determines whether the soft information for a particular index is reliable enough to be considered in the trace-back process, the soft information is considered uncertain or less reliable, the algorithm performs a comparison with another path looking back up to 6 steps (as denoted by j=1; j<=6). If the two paths differ and the index is within bounds (e.g., not less than 5 for this loop), the algorithm checks whether the current soft information is less than the soft information of the symbol 6 steps behind. If it is, the algorithm updates the soft information of the symbol 6 steps behind with the current one. This update is a part of the trace-back, where it seems to propagate a more confident decision backwards through the sequence.

The second loop (backward trace-back loop) is a symmetrical operation to the first loop but in reverse, going from i=45 down to i=26. It follows a similar logic but checks the path going forward (using i+j instead of i−j) and makes sure the index doesn't exceed the bounds of the sequence ((i+j) <46). The trace-back process seems to be refining the soft decisions of the symbols based on a comparison of two potential paths. If the current decision for a symbol is uncertain (below the threshold), and there is a discrepancy between the two paths, the algorithm updates or revises the soft information of the symbol in question to reflect a potentially more accurate decision based on the surrounding context.

Figure 9:
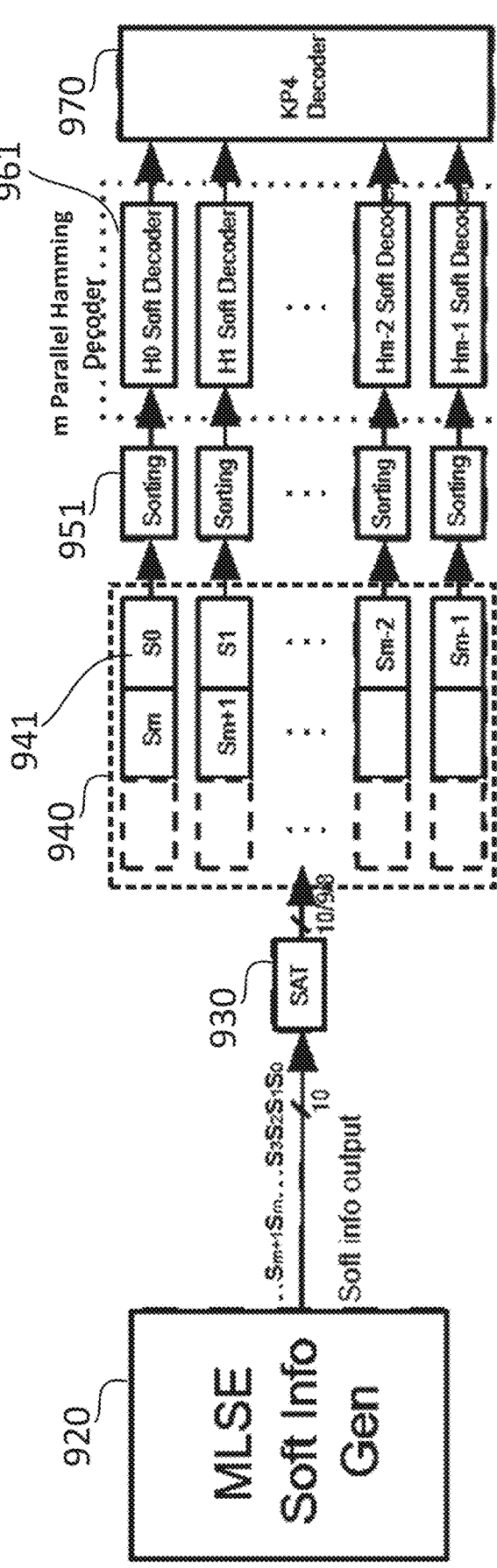
FIG. 9 is a simplified block diagram illustrating a system of using soft information of MLSE with reduced storage for Hamming decoding according to an embodiment of the subject technology.

As illustrated in FIG. 1, the hard decision coding symbol and soft information from MLSE can be selected by a control bit DECISION_SOURCE_CTRL for Hamming decoding using a Chase-type algorithm. In general, a forward error correction (FEC) decoder equipped with one of Hamming code, or Reed-Solomon (RS) code, or low density parity check (LDPC) code or other types of code can be implemented to use the soft information of MLSE for decoding the hard decision coding symbol. For Hamming decoding, however, storing entire soft information of inner code codewords is computationally expensive and not necessary. Based on the design of inner code decoding engine, one can tailor the storage of soft information to reduce complexity. FIG. 9 is a simplified block diagram illustrating a system of using soft information of MLSE with reduced storage for Hamming decoding according to an embodiment of the subject technology. In an embodiment, a sorting mechanism is implemented to generate p least reliable symbols for each Hamming codeword such that only p unreliable locations of symbols, instead of all soft information, are stored for subsequent inner code decoding process. In an example of FIG. 9, MLSE soft information generation block 920 (which, like the soft information generator 120 in FIG. 1, generates soft information based on intermediate information from MLSE block) produces a string of soft information output, . . . $S_{m+1}S_m$ . . . $S_3S_2S_1S_0$. Each S represents a Hamming codeword. Each Hamming codeword contains 64 PAM4 symbols. In the example, 10-bit soft information S comes out from MLSE soft information generation block 920. A saturation block 930 is configured to saturate soft information to certain bits before using and storing them for soft decoding of Hamming code. Optionally, v bits (v<10) are chosen after the saturation process. The value v is chosen based on system design complexity and performance trade-off. For example, v=5, i.e., 5-bit soft information (after saturation) is recommended. A channel interleaver 940 would reorder the bits or symbols in the received string of soft information output (after saturation) to split them in m Hamming codewords. The number m has to be determined based on design complexity and performance tradeoffs. When m=1, it means no channel interleaver is needed. When m>1, possible errors that are originally consecutive in the sequence of the symbols are spread out across multiple Hamming codewords. This helps to ensure that the Hamming decoder encounters fewer errors per codeword, staying within the correction capabilities of the FEC decoder.

Referring to FIG. 9, m numbers of sorting blocks 951 are implemented to process m codewords in parallel from which p least reliable symbols are determined for each codeword, where p<m×64. The sorting blocks 951 store only the determined p least reliable symbols and respective locations. Theoretically, there are m numbers of parallel Hamming decoders 961 followed respectively to the m numbers of sorting blocks 951 to receive the outputs from the m sorting blocks. Actually, only the determined and stored p least reliable symbols (per codeword) from corresponding p numbers of sorting blocks are really being processed by the p numbers of Hamming decoders 961. A KP4 decoder 970 may be connected following the Hamming decoders 961 for performing additional decoding works. Furthermore, only one bit of a PAM4 symbol (two bits, i.e., MSB and LSB) will be incorrect when this PAM4 symbol is indicated as unreliable. A one-bit register called FLIP_MSB will be used to indicate whether the Chase-type algorithm needs to be executed to flip MSB or LSB of an unreliable PAM4 symbol. Therefore, the soft information inner code decoding by the Hamming decoders is simplified to using a Chase-type algorithm for flipping p numbers of unreliable PAM4 symbol locations. The one-bit register FlIP_MSB, optionally, can be obtained by using slicer (hard decision) information.

Figure 10:
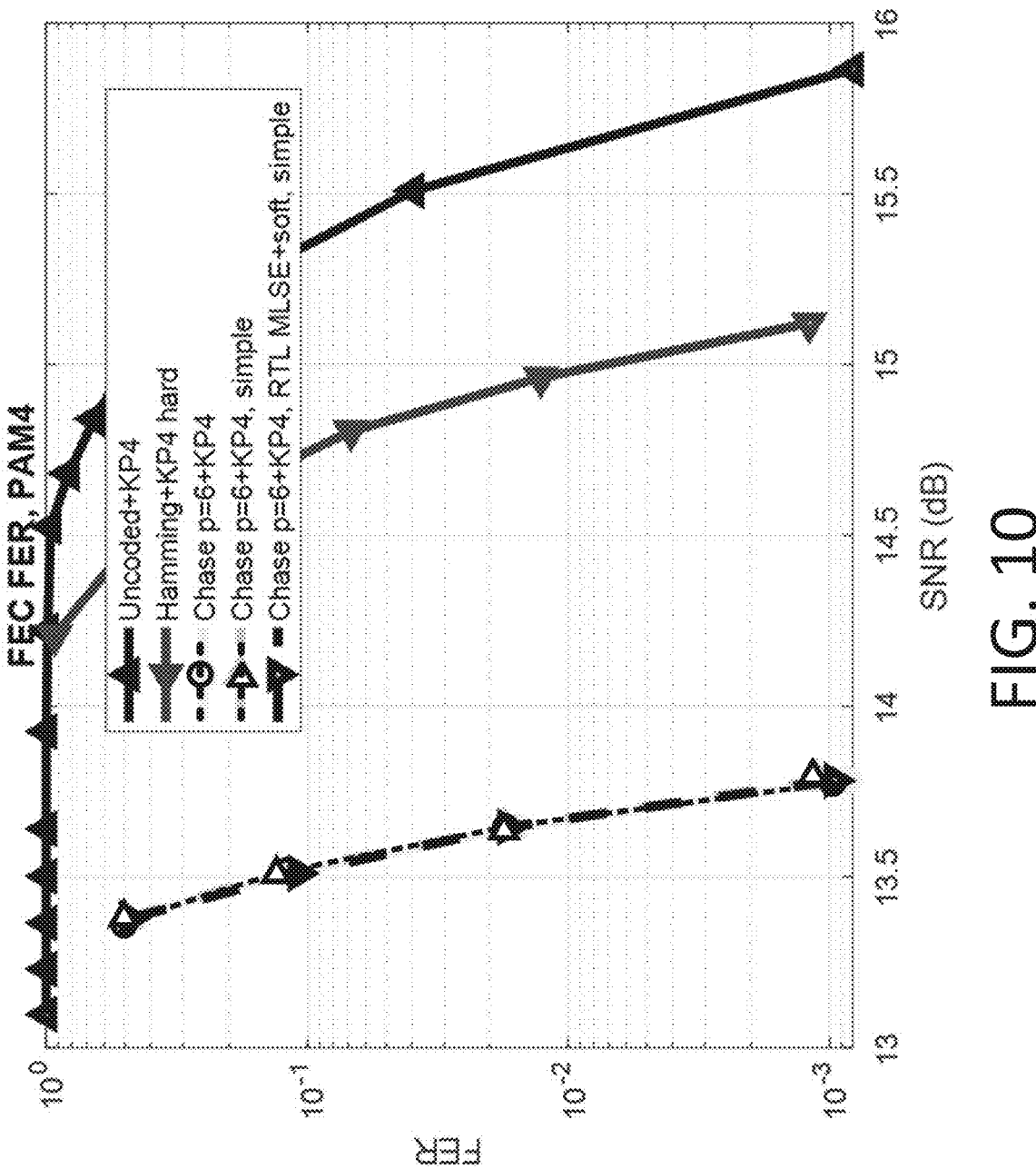
FIG. 10 is a plot illustrating frame error rate performance comparison between hard decoding and soft inner decoding of Hamming code using p=6 least reliable symbols per codeword with 1+0.25D filtered FFE inputs.
Figure 11:
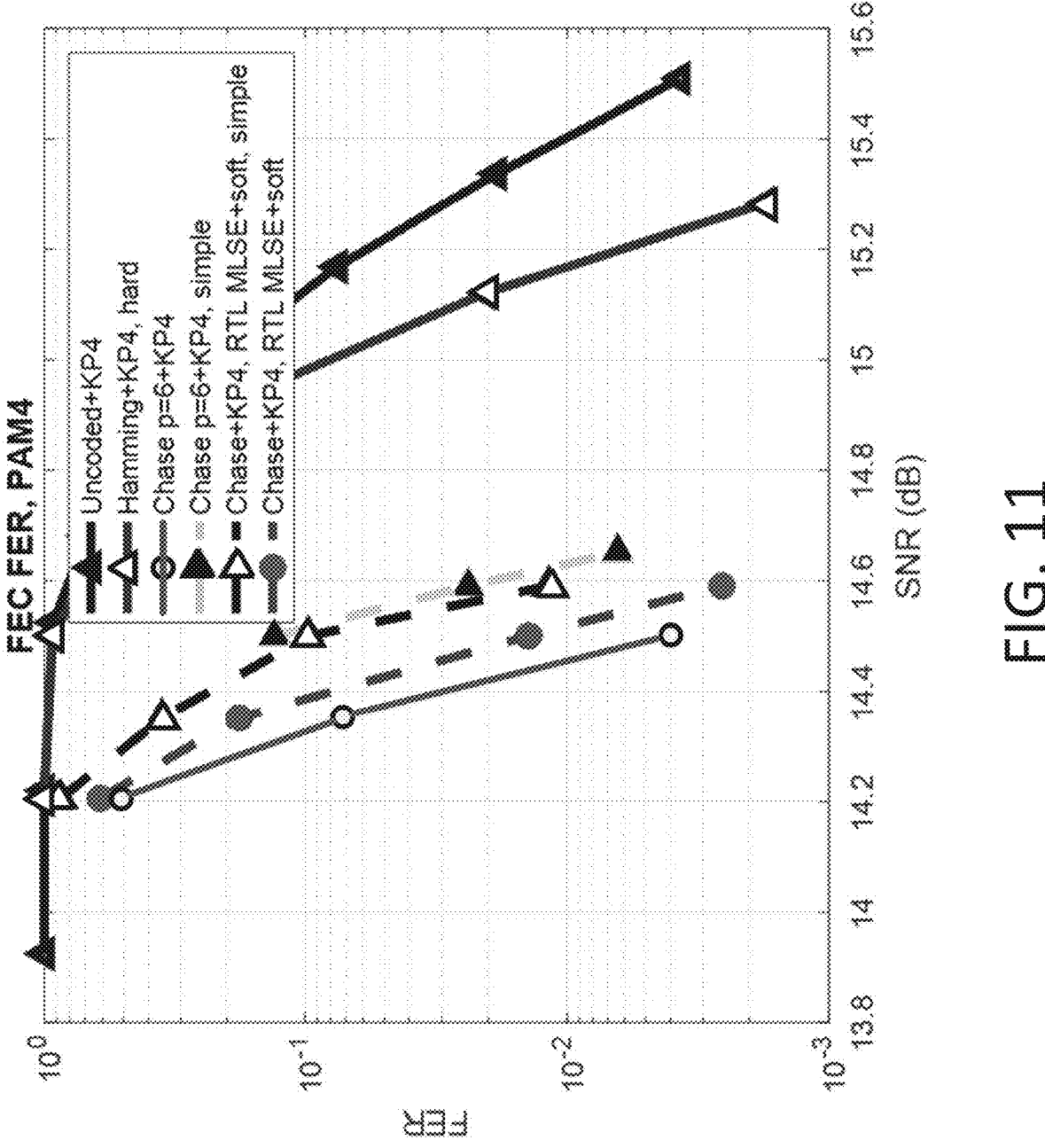
FIG. 11 is a plot illustrating performance comparison between hard decoding and soft inner decoding of Hamming code using p=6 least reliable symbols per codeword with 1+0.5D filtered FFE inputs.

FIG. 10 is a plot illustrating frame error rate performance comparison between hard decoding and soft inner decoding of Hamming code using p=6 least reliable symbols per codeword with 1+0.25D filtered FFE inputs. In this plot, KP4 decoder refers to a type of Forward Error Correction (FEC) decoder that is specifically designed for use in high-speed optical communication systems. RTL MLSE refers to a hardware-based implementation of the MLSE algorithm, specified at the register-transfer level of abstraction, allowing for optimized real-time operation in digital communication systems. In the legend of the figure, "Uncoded+KP4" refers to a case without Hamming decoding but directly feeding the data into KP4 decoder, which yields the highest frame error rate (FER) for a given signal-to-noise ratio (SNR). "Hamming+KP4 hard", refers to a case that only MLSE hard decision is used in Hamming decoding plus KP4 decoding, SNR is improved compared to the case of "Uncoded+KP4" but still very high. The next three groups respectively represent cases of using soft information for inner code Hamming decoding. "Chase p=6+KP4" refers to a case of using soft inner decoding of Hamming code with p=6 least reliable symbols per codeword and the soft information being updated (revised) by soft information traceback (i.e., step 3 of generating soft information of MLSE). "Chase p=6+KP4, simple" refers to a similar case where no soft information trace back is included to update the soft information used for inner code decoding. "Chase p=6+KP4, RTL MLSE+soft, simple" refers to the same case as the previous one but with the specific hardware implementation of the MLSE algorithm. Nevertheless, with soft information being added to the Hamming decoding, the code error correction performance in terms of FER and corresponding SNR is greatly improved. FIG. 11 is a plot illustrating a performance comparison between hard decoding and soft inner decoding of Hamming code using p=6 least reliable symbols per codeword with 1+0.5D filtered FFE inputs. This figure is similar to FIG. 10 except that a 1+0.5D filter is used to replace a 1+0.25D filter to produce the filtered FFE outputs as MLSE inputs. The plots of the two figures indicate that for 1+0.25D channel (FIG. 10), doing soft information trace back or not yields to similar performance. For 1+0.5D channel (FIG. 11), due to the frequent occurrence of large bursts, including soft information track back to revise the soft information of MLSE for inner code decoding in Hamming decoder performs better than simply assigning delta values as soft information.

In an alternative embodiment, a diagnostic feature associated with the subject technology of generating soft information of MLSE for concatenated FEC in digital signal processing. Since each MLSE engine works on each of multiple (like 40) filtered FFE outputs, the diagnostic feature can dump the related register values such as hard decision coding symbols, all intermediate state-state transfer information values, delta values, etc. based on the trigger that soft information<DELTA_THRSH. Firmware can read out those values for debug.

While the above is a full description of the specific embodiments, various modifications, alternative constructions and equivalents may be used. Therefore, the above description and illustrations should not be taken as limiting the scope of the present invention, which is defined by the appended claims.

What is claimed is:

1. An apparatus for generating soft information from a Maximum Likelihood Sequence Estimation (MLSE) process comprising:

a feed-forward equalizer receiving signals to produce equalized outputs;

a filter coupled to the feed-forward equalizer in an adaptive equalizer loop to provide MLSE inputs at a series of time indices based on filtering adaptation of the equalized outputs;

a MLSE block configured to process the MLSE inputs to generate hard decision coding symbols and intermediate path metric information for the series of time indices;

a soft information generator configured to generate soft information corresponding to each hard decision coding symbol at each of the series of time indices based on the intermediate path metric information;

a multiplexer combining the soft information and the hard decision coding symbols; and a forward error correction decoder configured to use the soft information for inner code decoding of the corresponding coding symbol.

2. The apparatus of claim 1, further comprising:

a saturation block in a channel following the soft information generator to saturate each 10-bits soft information to v-bits data;

a channel interleaver to split the v-bits data to m codewords; each codeword including 64 PAM4 symbols and m sorting blocks following the channel interleaver to generate and store p least reliable symbols from each of the m codewords;

wherein the number m (m>1), v (v<10), and p (p<m×64) are selected based on design complexity and performance tradeoff.

* * * * *